US005593021A

United States Patent [19]
Chwieralski et al.

[11] Patent Number: 5,593,021
[45] Date of Patent: Jan. 14, 1997

[54] ELECTRIC SWITCH WITH DETECTOR PROBE

[75] Inventors: Alfred Chwieralski, Cologne; Rolf Wecke, Porta Westfalica, both of Germany

[73] Assignees: Bernstein Senso-Plus GmbH, Bückeburg; Pulstonic Merten GmbH & Co. AG, Wiehl Bomig, both of Germany

[21] Appl. No.: 423,532

[22] Filed: Apr. 17, 1995

[30] Foreign Application Priority Data

Apr. 15, 1994 [DE] Germany .......................... 44 12 923.8

[51] Int. Cl.$^6$ .................................................. H01H 9/02
[52] U.S. Cl. .......................... 200/303; 200/293; 200/295
[58] Field of Search ..................................... 200/303, 293, 200/294, 295, 297, 307, 47, 336, 564, 565, 567, 333; 220/402, 306

[56] References Cited

U.S. PATENT DOCUMENTS

| | | | |
|---|---|---|---|
| 2,921,147 | 1/1960 | Hutt | 200/303 |
| 4,071,720 | 1/1978 | Kajci et al. | 200/303 |
| 4,389,555 | 6/1983 | Guinan | 200/303 |
| 4,785,240 | 11/1988 | Newell et al. | 200/303 |
| 5,276,299 | 1/1994 | Marsh | 200/47 |

*Primary Examiner*—David J. Walczak
*Attorney, Agent, or Firm*—Henry M. Feiereisen

[57] ABSTRACT

An electrical switch of a type having a detector probe with a sensor and a mounting, includes a housing having a bottom and a top which are detachably connected together solely by complementary locking elements. The mounting of the detector probe is rotatably supported in the top via a trunnion and secured by a fixture. Snapped onto the top is a cover which secures, partly via the fixture, the locking elements in their locking position and also secures the fixture in place, to thereby attain an assembly of the components of the switch without resorting to the use of screw fasteners.

12 Claims, 8 Drawing Sheets

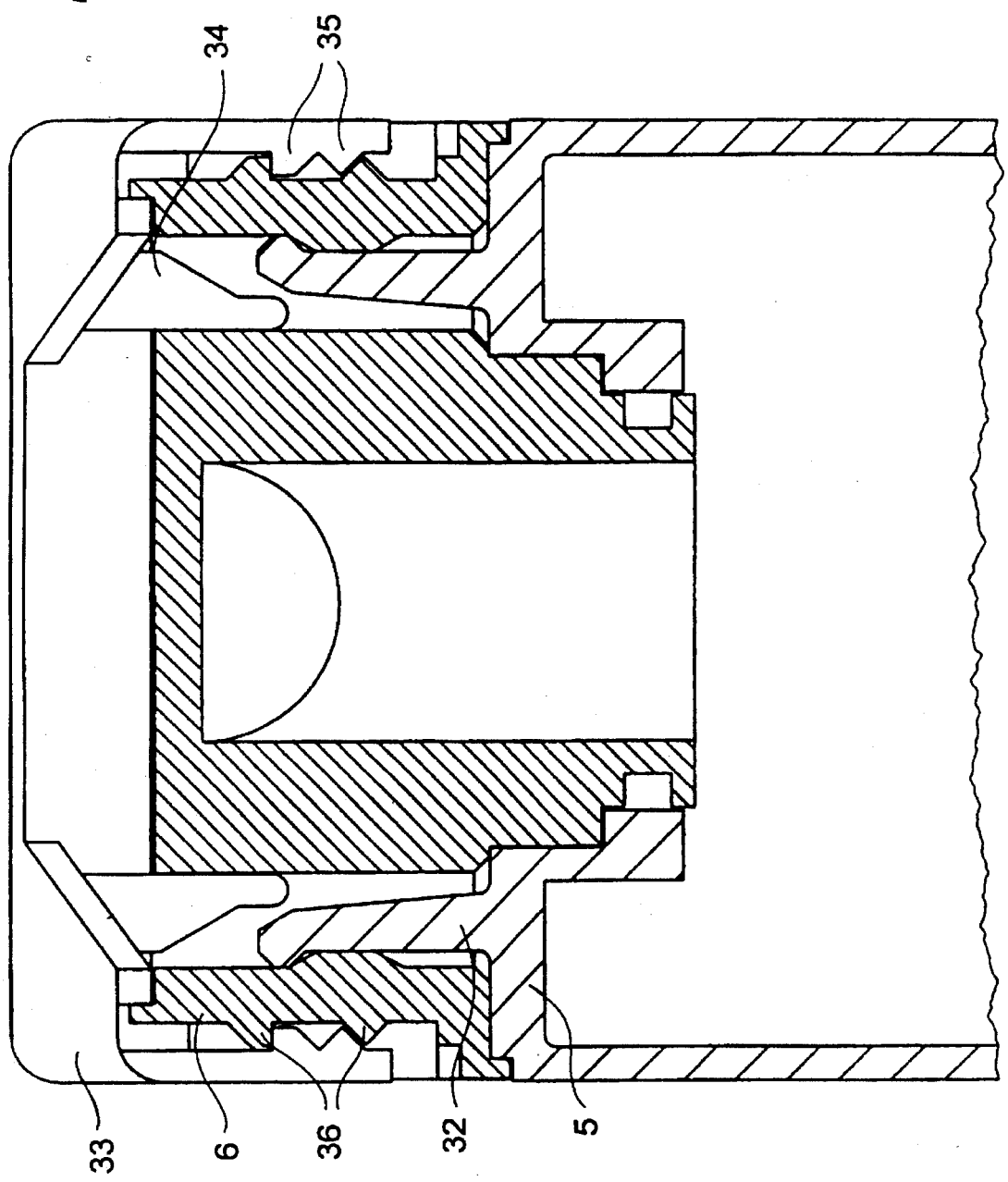

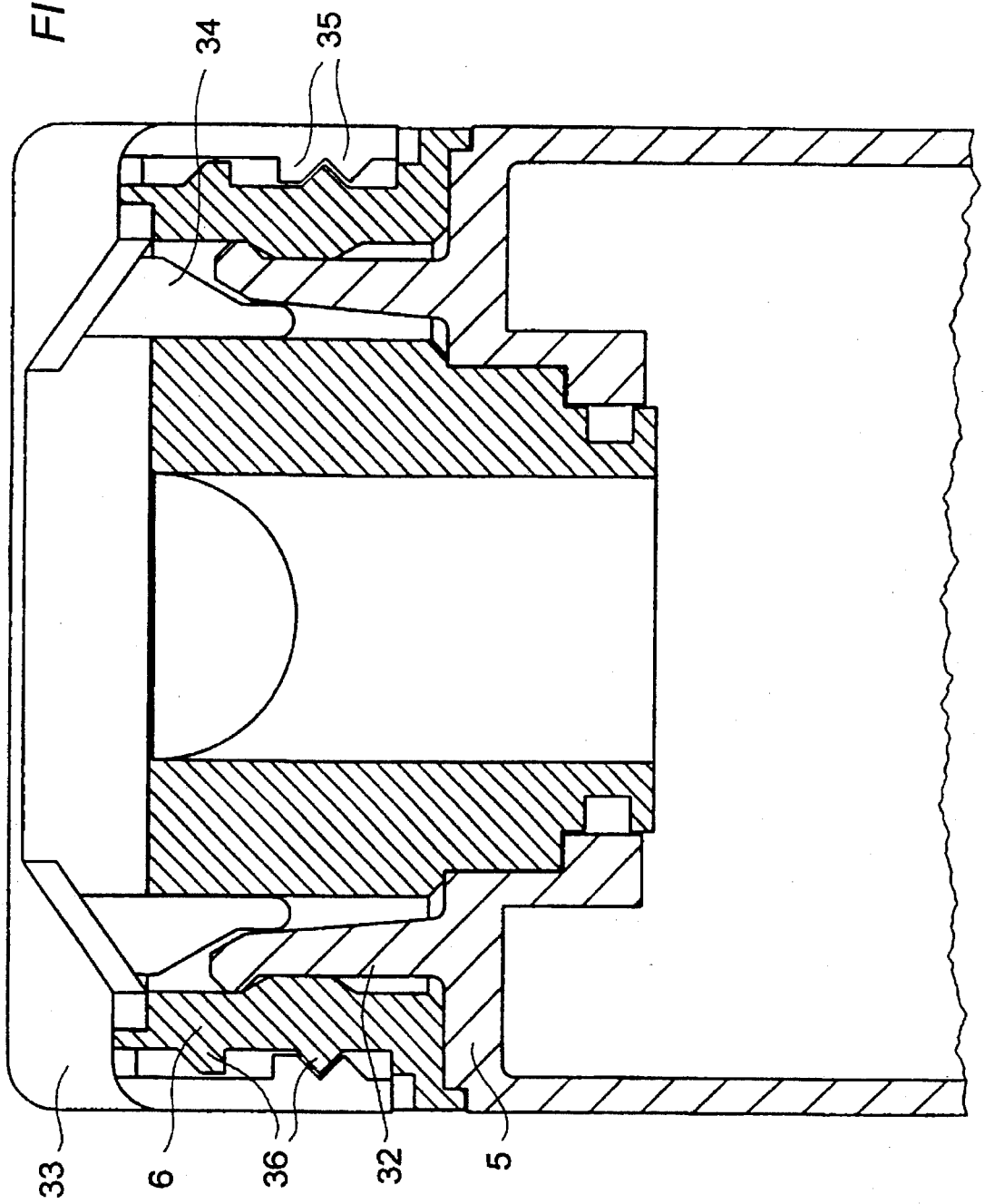

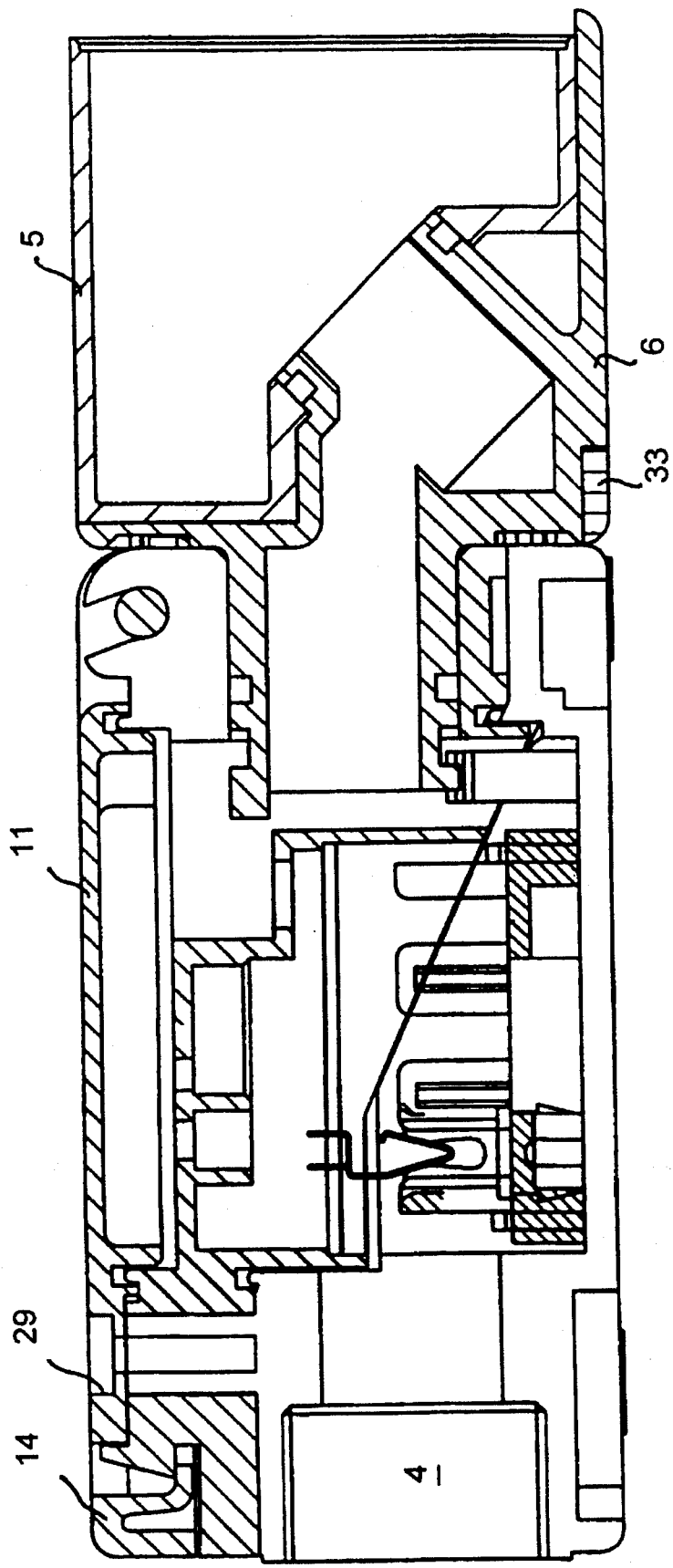

ELECTRIC SWITCH WITH DETECTOR PROBE

BACKGROUND OF THE INVENTION

The present invention refers to an electric switch of a type having a detector probe and including a housing with a bottom portion and a top portion that is detachably secured to the bottom portion, with the probe having a mounting rotatably secured in the top portion by means of a fixture.

It will be understood that the term "electric switch" as referred to in general in the following description means any type of device including electronic, optoelectric and like components for receiving, evaluating and transmitting control impulses that are registered by the probe, whereby the probe itself may operate inductively, capacitively, optically, with ultrasonic and/or mechanically.

The German utility model DE-GM 83 10 483 describes a switch of this type in form of a contactless operating electronic switch in which the top and the bottom of the housing are connected together, on the one hand, by a plug-in flap and a holder, and, on the other hand, by screw fasteners. Thus, the assembly becomes relatively complicated. The mounting of the probe is secured in the top of the housing by means of a mounting which includes a one-piece spring in form of a hair needle engaging a circumferential groove of a trunnion of the mounting. This hair needle type locking element cooperates with separate abutments in the top so that the assembly of the switch becomes even further complicated. Further provided is a ratchet to permit the probe to be positioned in different rotational alignments. At the location of the ratchet, the probe is split and has besides the mounting a sensor element which can be arranged in various positions onto the mounting.

SUMMARY OF THE INVENTION

It is an object of the present invention to provide a switch of the above-stated type which retains all components securely together while being easily assembled and dismantled.

This object and others which will become apparent hereinafter are attained in accordance with the present invention by connecting the top portion and the bottom portion of the housing with each other via complementary locking elements, and by attaching a cover to the top portion by which at least one pair of complementary locking elements is secured in their locked position, and the fixture for the mounting of the probe is secured in place.

In accordance with the teaching of the present invention, the top and the bottom are solely connected together through locking elements without resorting to any threaded connections so that the assembly and disassembly of the switch becomes considerably simplified. The cover which is snapped onto the top portion assumes a multiple blocking function by securing the locking position of at least one of the pairs of complementary locking elements effecting the connection of the top portion and the bottom portion of the housing and by additionally securing the fixture for the mounting of the probe in place. The essential components of the switch are thus securely retained in their respective fixing and locking positions in a very reliable manner, regardless of the position the switch assumes when being mounted to a stationary base.

In accordance with a further feature of the invention, the fixture for the mounting of the probe within the housing top includes at least one wedge element by which a pair of complementary locking elements of the snap connection between the top and the bottom portion of the housing is blocked when the fixture is in place, to thereby additionally secure the connection between the top and the bottom portion of the housing.

At the side facing the housing, the mounting of the probe is preferably formed about a pitch circle with a ratchet for cooperation with catches provided at the respective end of the cover and engaging in gaps between the teeth of the ratchet when the cover closes the top portion. This also considerably facilitates the assembly of the switch and the securement of components within. Thus, the probe is secured in place and can be repositioned only when opening the cover to release the catches from the ratchet.

In accordance with another feature of the invention for use in an electric switch with a split detector probe and a bracket for connecting the components of the probe with each other, the cover blocks the bracket in place in closed position thereof when the detector probe is in an alignment relative to the housing in which the bracket is positioned in opposite relationship to the cover. A release of the bracket is then possible only when the cover is moved to its open position. Thus, the cover assumes a further function, that is the release of the bracket to allow a repositioning of the probe relative to the housing. When the top portion is closed by the cover, the bracket of the probe is fixed in place and cannot be removed. In other alignments of the detector probe relative to the housing in which the cover does not block the bracket of the probe, the respective rotational positions of the probe are secured directly by the switch housing.

BRIEF DESCRIPTION OF THE DRAWING

The above and other objects, features and advantages of the present invention will now be described in more detail with reference to the accompanying drawing in which:

FIG. 5a is a cross sectional view of the switch illustrating in detail the connection between the probe and the mounting, with the bracket being in a release position;

FIG. 5b is a cross sectional view of the switch illustrating in detail the connection between the probe and the mounting, with the bracket being in a locking position;

FIG. 7 is a longitudinal section of an assembled switch according to the invention, with attached bracket.

DETAILED DESCRIPTION OF PREFERRED EMBODIMENTS

Figure 1:
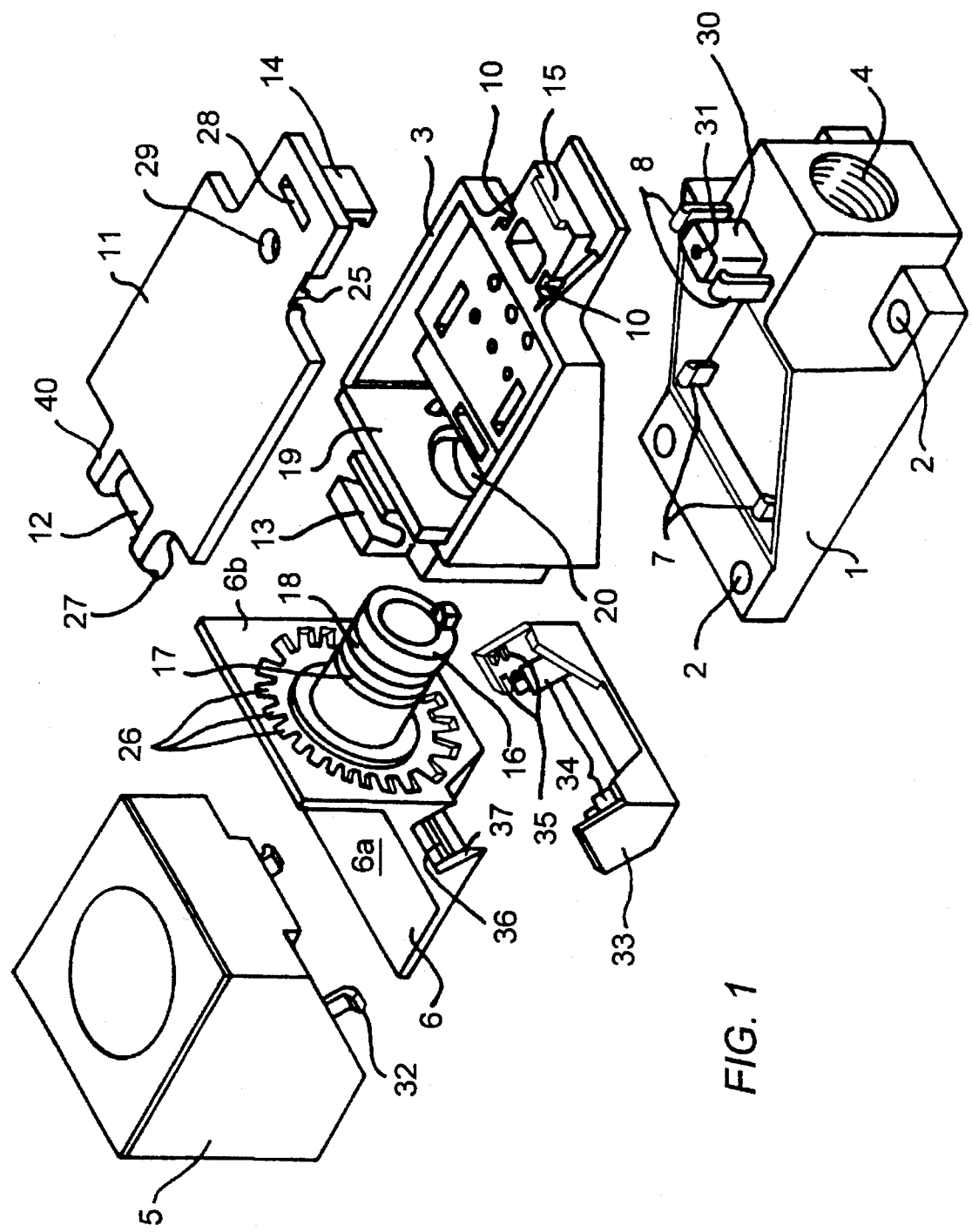
FIG. 1 is a simplified, schematic front perspective view, in exploded illustration, of one embodiment of a switch according to the present invention.

Throughout all the Figures, the same or corresponding elements are generally indicated by the same reference numerals.

Turning now to the drawing, and in particular to FIG. 1, there is shown a simplified, schematic front perspective view, in exploded illustration, of one embodiment of a switch according to the present invention. FIG. 1 shows the switch, e.g. a contactless operating switch, with the essential components of the switch housing and the detector probe, whereby an illustration of the electric and electronic components within the interior of the switch housing are omitted for sake of simplicity, as they do not form part of the present invention.

The switch housing includes a bottom portion 1 which has a bottom plate provided with bores 2 at its corners for attachment of the entire switch to a fixed base or the like by means of suitable screw fasteners. Detachably secured to the bottom portion 1 is a top portion 3, with the partition between the bottom 1 and the top 3 extending diagonally. On one end, the bottom portion 1 is provided with a central access opening for insertion of an electric cable (not shown). Although not shown in detail, the electrical terminals of the switch are located in the bottom 1 while the top portion 3 essentially accommodates a printed board assembled with electronic components, plug-in connections which cooperate with the terminals in the bottom portion 1 as well as an electric connection for the detector probe. The detector probe is, e.g. of block-shaped configuration, and is of a type having a sensor 5 and a mounting 6.

The bottom portion 1 and the top portion 3 are detachably connected to each other solely by way of snap-in connections, with the bottom 1 being provided relative to the diagonal partition plane, with two snap-in hooks 7 in the lower plane and with two snap-in hooks 8 in the upper plane. When attaching the top portion 3 to the bottom 1, the hooks 7 snap behind abutments 9 of the top portion 3 (FIG. 4) while the hooks 8 snap into pockets 10 of the top portion 3 which are provided at their inside walls with small beads (not shown), with the hooks 8 snapping behind these beads.

The top portions 3 is closable by a cover 11 having one end provided with a pair of projecting arms 40 which are spaced from each other to support an axle 12 therebetween. The axle 12 snaps into a support 13 at the corresponding end of the top portion 3 for rotatable support thereof. At the other axle-distant end, the cover 11 carries a downwardly extending L-shaped hook 14 which is engageable behind an abutment 15 situated at a suitable location on the top portion 3.

Figure 2:
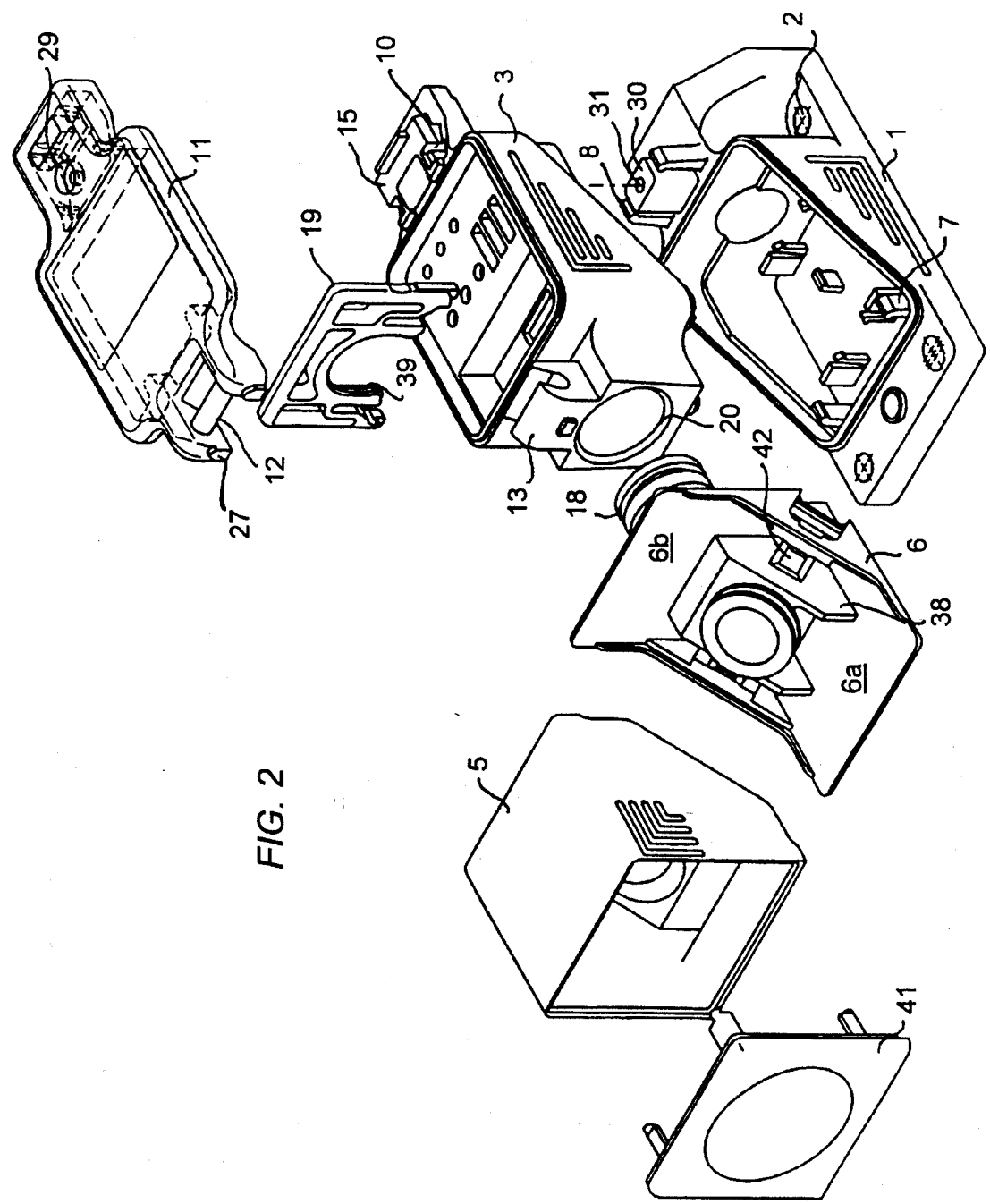
FIG. 2 is a simplified, schematic, rear perspective view, in exploded illustration, of the switch.

As described above, the detector probe includes the sensor 5 which is closable at the back by a lid 41 (FIG. 2) and secured by the mounting 6 to the top portion 3 of the housing. The mounting 6 is of substantially L-shaped configuration with a horizontal base 6a and a vertical front wall 6b which is traversed by a trunnion 16 that is supported by a structure 38 situated on the base 6a against the front wall 6b, as best seen in FIG. 2. The rear end of the trunnion 16 is slanted upwards. The forward end of the trunnion 16, projecting from the front wall 6b, includes a circumferential groove 17 for receiving a seal, and a circumferential groove 18 for cooperation with a lunette-type fixture 19 which is insertable from above into the top 3 along the inside walls of the top portion 3 to secure the trunnion 16 in place. As shown in particular in FIGS. 2 and. 4, the fixture 19 has a semicircular opening 39 which is downwardly open to engage the trunnion 16 after the mounting 6 is inserted through a front opening 20 (FIG. 2) of the top portion 3.

Figure 3:
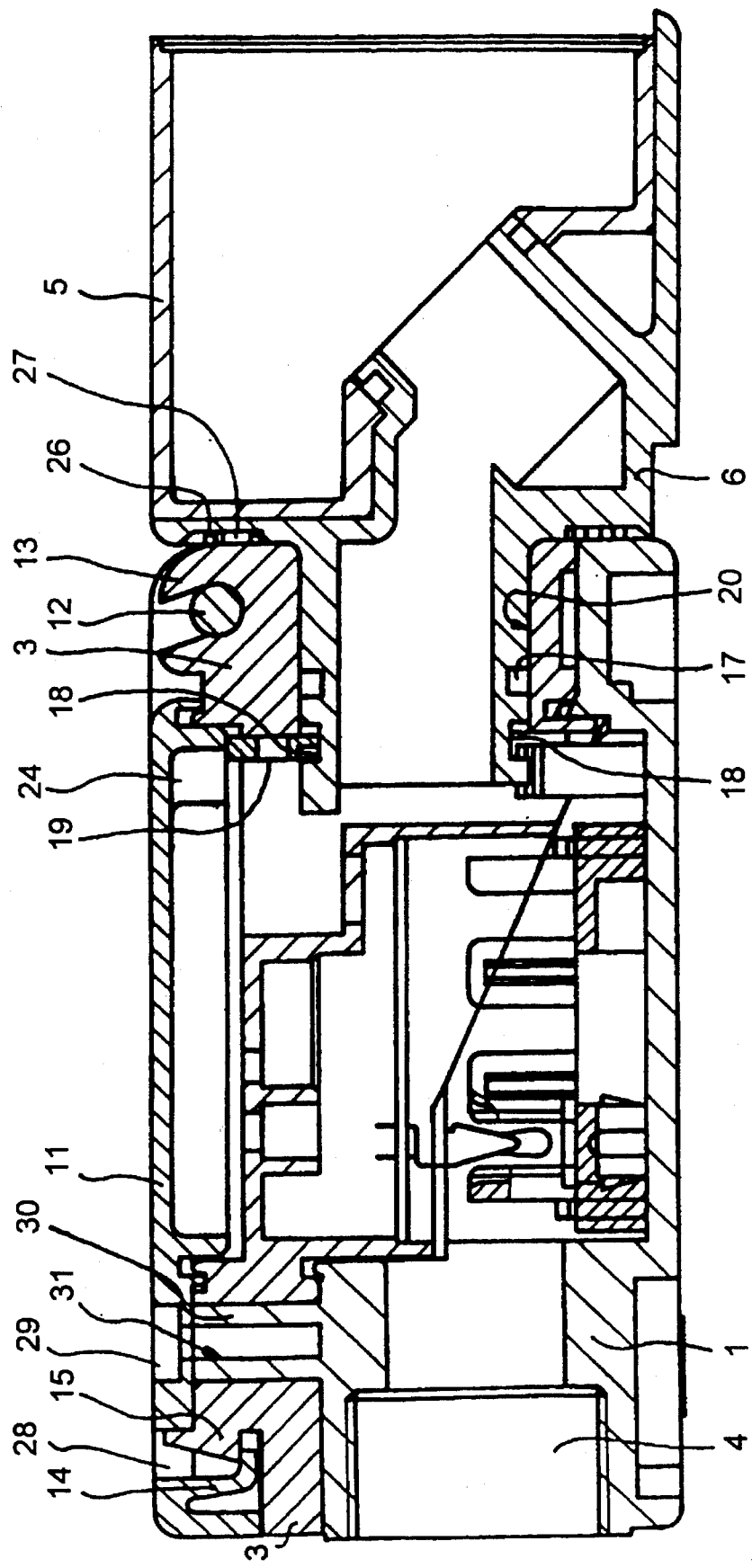
FIG. 3 is a longitudinal section of an assembled switch according to the invention.

The fixture 19 includes two clips 22 which are provided with narrow retainer webs 21 respectively projecting inwardly from the clips 22 and engaging in the circumferential groove 18 of the trunnion 16 after the mounting 6 is attached to the top portion 3 (as shown in FIG. 3) and the fixture 19 is inserted, with the clips 22 enclosing the trunnion 16. After insertion of the fixture 19 over the trunnion 16, the mounting 6 is securely fixed in place.

Figure 4:
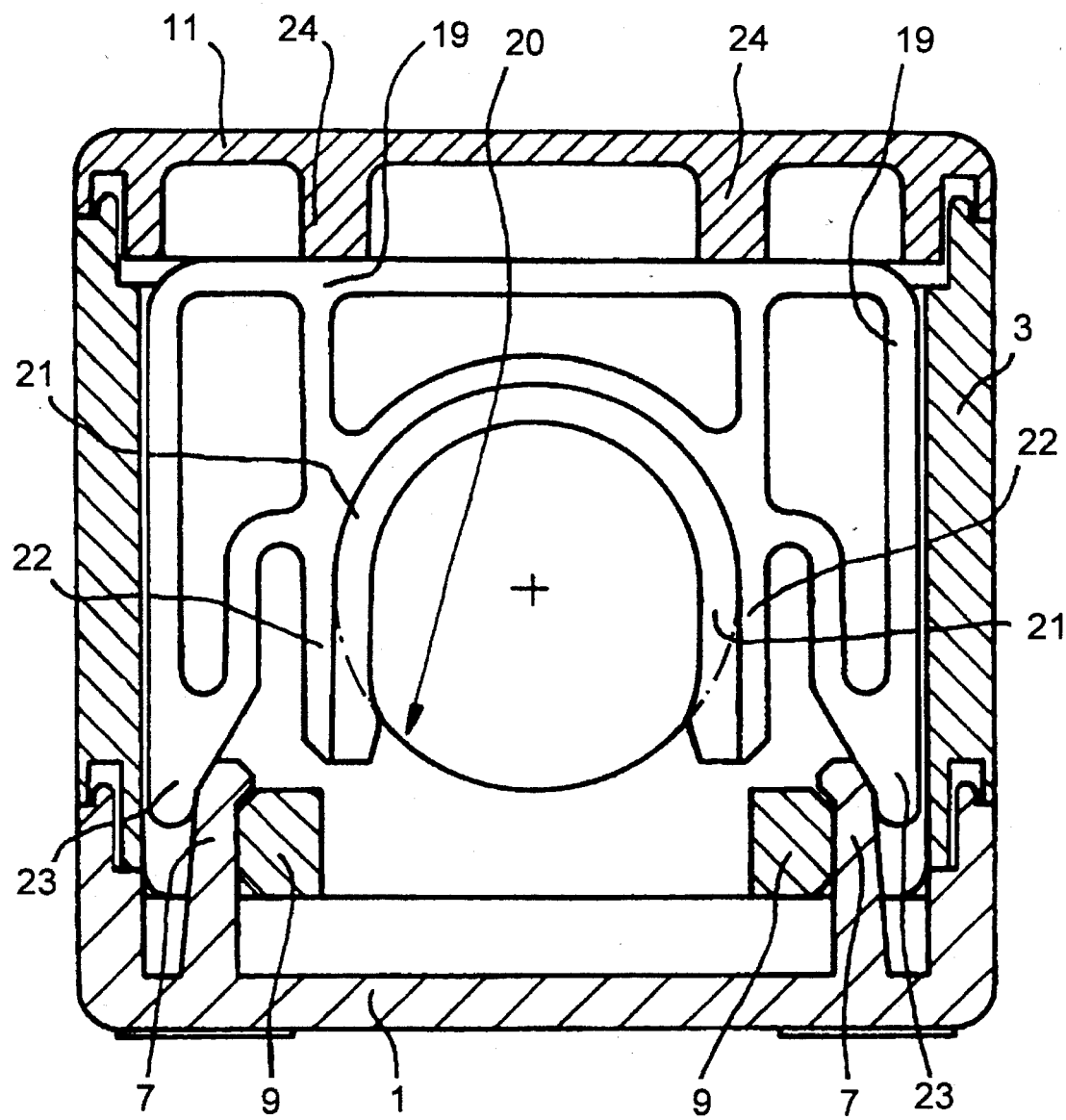
FIG. 4 is a cross sectional view of the switch, illustrating in detail a fixture for the mounting of the probe of the switch.

The fixture 19 is further provided with outer wedges 23 which are formed in one piece with the clips 22 and wedge behind the hooks 7 of the bottom portion 1 when the top portion 3 is attached to the bottom portion 1 so as to force the hooks 7 tightly against the abutments 9 to secure the connection between the top portion 3 and the bottom portion 1, as shown in particular in FIG. 4. Thus, the insertion of the fixture 9 not only secures the mounting 6 in place but also secures the interlocking relationship between the hooks 7 and the complementary abutments 9.

As further shown in FIG. 4, the cover 11 is provided at a suitable location with two inwardly projecting cams 24 by which the fixture 19 is pushed downwards when the cover 11 closes the top portion 3 to thereby secure the fixture 19 in place. Closing the cover 11 thus accomplishes an effective securement of the trunnion 16 of the mounting 6 in the top portion 3 and at a same time blocks the locked connection between the snap-in hooks 7 and the abutments 9.

The cover 11 is further provided with two prism-shaped wedges 25, as shown in FIG. 1, by which the locked connection of the hooks 8 in the pockets 10 is secured, when the cover 11 closes the top portion 3. Thus, the cover 11 also blocks in closing position thereof the connection of the hooks 8 in the pockets 10.

In accordance with the present invention, the essential components of the switch housing and the detector probe can thus be assembled in a reliable manner without using any screwed connections.

Such switches frequently require the ability to position the probe in different alignments to suit varying applications and conditions and to also secure the probe in the desired rotational position. For that purpose, the front wall 6b of the mounting 6 is formed with a ratchet 26 which extends about a pitch circle having a circular pitch of e.g. 150. The ratchet 26 cooperates with respective catches 27 which are formed on the arms 40 at the rear end of the cover 11. In the closed position of the cover 11, the catches 27 engage respective gaps of the ratchet 26 to secure the probe in the respectively set rotational position. By simply opening the cover 11, the catches 27 are disengaged from the ratchet 26 to allow the probe to be turned into a different position.

The cover 11 can be opened in a simple manner by inserting a respective tool, e.g. a screwdriver, through an access opening 28 so as to disengage the hook 14 from the abutment 15, as best seen from FIG. 3.

In some instances, it is necessary to provide the switch with an additional closing mechanism. Accordingly, as shown in particular in FIG. 3, the cover 11 is provided with a bore 29 which is in alignment with a bore 31 of a projection 30 arranged between the hooks 8 on the upper level of the bottom 1. The aligned bores 29, 31 allow insertion of a self-tapping screw as indicated by dashdot lines in FIG. 2 to thereby further secure the cover 11 to the top portion 3.

As best seen in FIGS. 2 and 5a, the sensor 5 of the detector probe is provided with snap-in hooks 32 which are engageable through passages 42 in the mounting 6 and snap behind beads formed on the inside wall of the passages 42. This locked connection between the sensor 5 and the mounting 6 is further secured by a bracket 33 which is attached in diagonal direction onto one corner of the mounting 6, as shown in particular in FIG. 6b by way of arrow 44. The bracket 33 is formed on each side at a distance from the outer side wall with a key 34 for engagement between the hook 32 and the facing wall area of the mounting 6. Projecting inwardly from the side walls of the bracket 33 are small webs 35 which cooperate with complementary catches 36 formed in the bracket-receiving base 37 of the mounting 6.

In order to prevent an unintentional loss, the bracket 33 is permanently received in the base 37 of the mounting 6 in such a manner that the bracket 33 can be displaced in direction of arrow 46 but is secured against rotation relative to the mounting 6 by the base 37. In the release position of the bracket 33 shown in FIG. 5a, the webs 35 are received between the spaced catches 36, with the upper catch 36 forming a stop member. In this position, the keys 34 are disengaged from the spacing between the hooks 32 and the inside wall surface of the mounting 6.

When pushing the bracket 33 in direction of arrow 44 (FIG. 6b), the keys 34 are wedged behind the hooks 32 to force them to hook behind the beads 43. At a same time, the webs 35 are forced downwards to engage the lower catch 36, as shown in FIG. 6b. Suitably, the lower catch 36 has a configuration to complement the contour of the spacing between the webs 35. As shown in FIG. 7, the bracket 33 is flush-mounted to the detector probe.

Figure 6A:
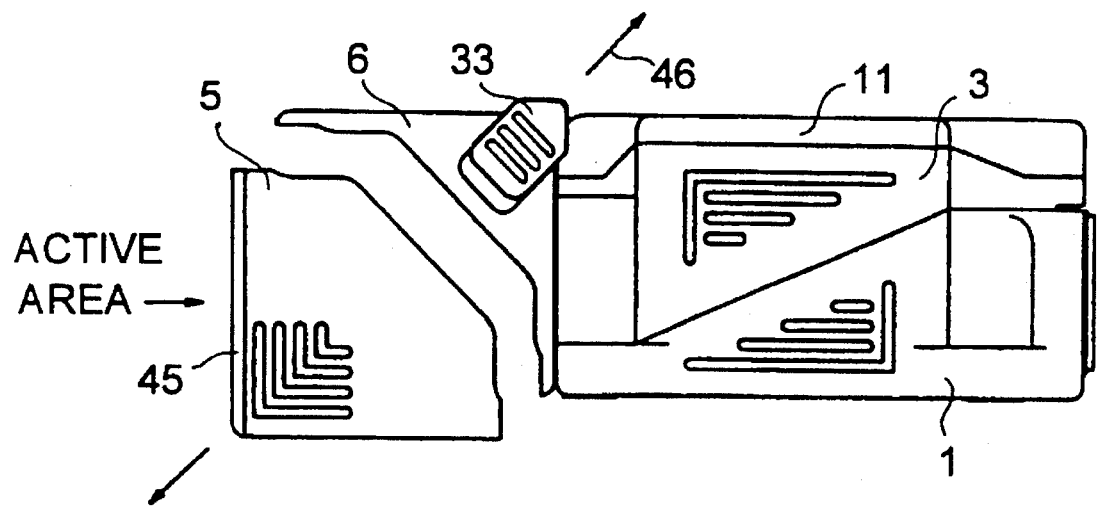
FIGS. 6a and 6b show schematic side views of the connection between the probe and the mounting, respectively illustrating an alignment of the detector probe with the bracket in opposite relationship to the cover.
Figure 6B:
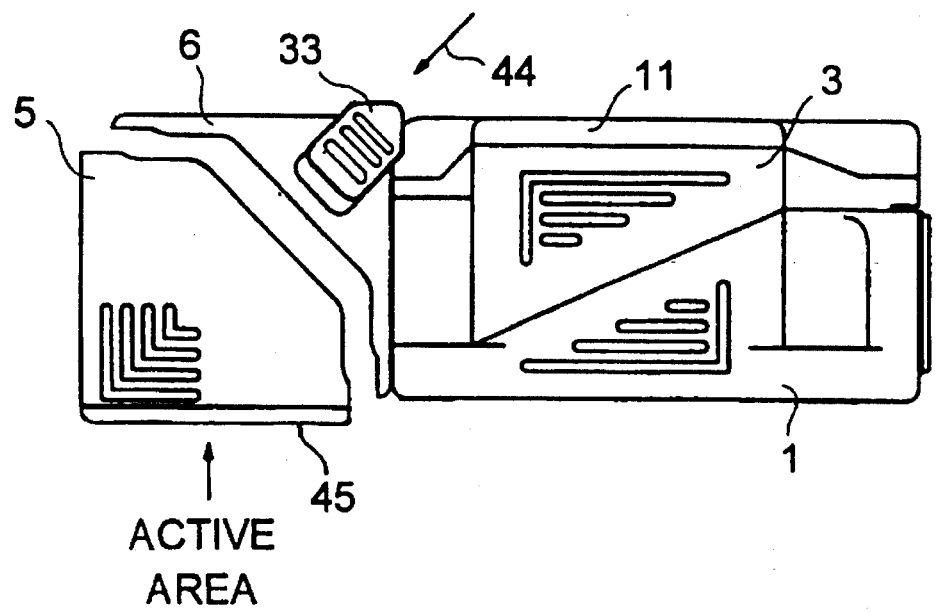

FIGS. 6a and 6b show the arrangement of the sensor 5 of the detector probe upon the mounting 6, with the active area 45 of the sensor 5 facing forward in FIG. 6a and facing downwards in FIG. 6b. In the position of the detector probe, shown in FIGS. 6a and 6b, in which the bracket 33 opposes in its longitudinal extension the back of the cover 11, the rear ends of the arms 40 of the cover 11 secure the bracket 33 in its locking position. When now opening the cover 11 into a semi-open, i.e. slanted, position so as to extend in a plane coinciding with the diagonal plane, the bracket 33 can be released and withdrawn, as indicated by arrow 46 in FIG. 6a so as to allow a repositioning of the sensor 5 relative to the mounting 6. After pushing the bracket 33 in direction of arrow 44 and closing of the cover 11, the bracket 33 occupies the locked position shown in FIG. 5b. In all other rotational positions of the probe 5, 6, the bracket 33 is secured in place partially by the cover 11, mainly however by the lower plane of the bottom portion 1.

Suitably, the cover 11 is made of transparent material, such as acrylic glass to allow view of an operating panel with display elements, designations and the like disposed on the upper side of the top portion 3, without requiring opening or removal of the cover 11.

The configuration and structure of the switch according to the present invention has the additional advantage that the cover performs a safety function because the attachment of the cover onto the top portion is possible only when the top and the bottom portion are properly engaged and the detector probe is properly inserted and secured by the fixture 19. Therefore, a closing of the cover automatically determines the correctness of all preceding assembly steps.

While the invention has been illustrated and described as embodied in an electric switch with detector probe, it is not intended to be limited to the details shown since various modifications and structural changes may be made without departing in any way from the spirit of the present invention.

We claim:

1. An electrical switch housing; comprising a bottom portion and a top portion;

snap-in locking means for detachably connecting said top portion with said bottom portion;

a detector probe with a sensor;

a mounting for accommodating said detector probe with a sensor;

fastening means for rotatably securing said mounting in said top portion; and a cover snapped onto said top and movable between an open position for allowing access to said top portion and a closed position, said cover having means thereon for securing said locking means in a locking position and for securing said fastening means in place when said cover is in said closed position.

2. The electric switch housing of claim 1 wherein said locking means includes a first and second pair of complementary locking elements, respectively provided on said top portion and said bottom portion, said cover acting at least upon one of said first and second pairs of locking elements.

3. The electric switch housing of claim 2 wherein said cover is provided at an end thereof with at least one wedge which secures in said closed position of said cover the locking position between said top portion and said bottom portion via said one pair of complementary locking elements.

4. The electric switch housing of claim 1 wherein said top portion has a first locking element, said cover having one end swingably mounted to said top portion and another end supporting a second locking element for cooperation with said first locking element of said top.

5. The electric switch housing of claim 4 wherein said cover includes an access opening for allowing a tool to act upon said locking element of said cover.

6. The electric switch housing of claim 1 wherein said fastening means includes a trunnion insertable in said top portion and a fixture in the form of a clamp with inwardly projecting webs for engagement in a circumferential groove of said trunnion, said cover being provided with at least one cam pushing upon said fixture to retain said fixture in place in closing position of said cover.

7. The electric switch housing of claim 6 wherein said locking means include a pair of complementary locking elements respectively formed on said top portion and said bottom portion, said fixture having at least one wedge for securing said locking elements in their locking position when said fixture is in place.

8. The electric switch housing of claim 1 wherein said mounting has one side which faces said housing, said side being formed with a ratchet extending over a pitch circle, said cover being formed with a catch engageable, when said cover is in said closed position, in gaps of said ratchet.

9. The electric switch housing of claim 1 wherein said detector probe is of split configuration, further comprising a bracket for securing said detector probe when being assembled, said bracket opposing said cover in a selected rotational position of said detector probe, with said cover, when said bracket is in said selected position, securing said bracket when in said closed position and enabling release of said bracket when in said opened position.

10. The electric switch housing of claim 9 wherein said detector probe is of block-shaped configuration, said bracket being attachable in diagonal direction upon a corner of said detector probe, with said cover enabling release of said bracket such that said bracket is movable in a slanted direction approximately coinciding with said diagonal direction.

11. The electric switch housing of claim 1 wherein said cover is made at least partly of transparent material.

12. The electric switch housing of claim 1 wherein said cover and said top portion are provided with aligned bores and further comprising a screw fastener positioned in said bores for additionally securing said cover to said top.

* * * * *